United States Patent [19]

Kamakura

[11] Patent Number: 5,047,970
[45] Date of Patent: Sep. 10, 1991

[54] APPARATUS FOR DISPLAYING SIMULATION RESULT

[75] Inventor: Satoko Kamakura, Itami, Japan

[73] Assignee: Mitsubishi Denki Kabushiki Kaisha, Tokyo, Japan

[21] Appl. No.: 359,329

[22] Filed: May 31, 1989

[30] Foreign Application Priority Data

Feb. 8, 1989 [JP] Japan .................................. 1-28886

[51] Int. Cl.$^5$ ..................... G06F 15/60; G06F 15/72
[52] U.S. Cl. ................................. 364/578; 364/521
[58] Field of Search ............................. 364/578, 521

[56] References Cited

U.S. PATENT DOCUMENTS

| 4,694,411 | 9/1987 | Burrows | 364/578 |
| 4,775,950 | 10/1988 | Terada et al. | 364/578 |
| 4,791,593 | 12/1988 | Hennion | 364/578 |
| 4,815,024 | 3/1989 | Lewis | 364/578 |

Primary Examiner—Felix D. Gruber
Attorney, Agent, or Firm—Oblon, Spivak, McClelland, Maier & Neustadt

[57] ABSTRACT

A result of simulation for an object circuit is displayed as a circuit diagram in which respective elements in the object circuit are colored according to the simulation result so that the simulation result can be easily understood. The elements displayed in colors include not only active and passive elements but also signal lines interconnecting them and the branches of the signal lines, so that the result of the simulation can be displayed in detail in color.

7 Claims, 9 Drawing Sheets

| | | |
|---|---|---|
| Q1 | $(X_2, Y_1)$ | WHITE |
| R1 | $(X_5, Y_6)$ | WHITE |
| L1 | $(X_1, Y_1)(X_2, Y_1)$ | WHITE |
| L2 | $(X_3, Y_4)(X_3, Y_2)$ | WHITE |
| D1 | $(X_3, Y_1)$ | WHITE |
| R3 | $(X_1, Y_1)$ | WHITE |
| R2 | $(X_3, Y_2)$ | WHITE |

25

```
Q1  (X₂,Y₁)           WHITE
R1  (X₅,Y₆)           WHITE
L1a (X₁,Y₁)(X₃,Y₁)    WHITE  ─── 17
L1b (X₃,Y₁)(X₂,Y₁)    WHITE
L2a (X₃,Y₄)(X₃,Y₁)    WHITE
L2b (X₃,Y₁)(X₃,Y₂)    WHITE
R2  (X₃,Y₂)           WHITE
R3  (X₁,Y₁)           WHITE
D1  (X₃,Y₁)           WHITE
```

FIG. 7

|       | Q1    | Q2    | Q3    |
|-------|-------|-------|-------|
| IB    | 1μ    | ┆     | ┆     |
| IC    | 50μ   | ┆     | ┆     |
| VBE   | 0.72  | ┆     | ┆     |
| VBC   | −1.10 | ┆     | ┆     |
| VCE   | 0.50  | ┆     | ┆     |
| BETADC| 89.9  | ┆     | ┆     |

|    | I    |
|----|------|
| R1 | 52μ  |
| R2 | 30μ  |
| R3 | 20μ  |

8

| 1.982 | 0.200 | 1.322 |
| 1.983 | 0.300 | 1.355 |
| 1.984 |   ┆   |   ┆   |
| 1.985 |   ┆   |   ┆   |

FIG. 8

|  | Q1 | Q2 | Q3 |
|---|---|---|---|
| IB | 1 μ | ¦ | ¦ |
| IC | 50 μ | ¦ | ¦ |
| VBE | 0.72 | ¦ | ¦ |
| VBC | -1.10 | ¦ | ¦ |
| VCE | 0.50 | ¦ | ¦ |
| BETADC | 89.9 | ¦ | ¦ |

| | |
|---|---|
| Q1( $X_2, Y_1$ ) | BLUE |
| R1( $X_5, Y_6$ ) | BLUE |
| L1a( $X_1, Y_1$ )( $X_3, Y_1$ ) | WHITE |
| L1b( $X_3, Y_1$ )( $X_2, Y_1$ ) | RED |
| L2a( $X_3, Y_4$ )( $X_3, Y_1$ ) | BLUE |
| L2b( $X_3, Y_1$ )( $X_3, Y_2$ ) | YELLOW |
| R2( $X_3, Y_2$ ) | YELLOW |
| R3( $X_1, Y_1$ ) | WHITE |
| D1( $X_3, Y_1$ ) | WHITE |

| CURRENT | | |
|---|---|---|
| LOWER LIMIT | UPPER LIMIT | ASSIGNED COLOR |
| 0 ~ | 10 μA | RED |
| 10 ~ | 30 · | WHITE |
| 30 ~ | 50 · | YELLOW |
| 50 ~ | 60 · | BLUE |

| TRANSISTER OPERATING V. | ASSIGNED COLOR |
|---|---|
| $V_{BE} > 0.6(v)$<br>$V_{CE} < 0.2(v)$ | RED (SATURATION) |
| $V_{BE} < 0.6(v)$<br>$V_{CE} < 0.2(v)$ | YELLOW (NON-OPERATIVE) |
| $V_{BE} > 0.6(v)$<br>$V_{CE} > 0.2(v)$ | BLUE (GOOD) |

APPARATUS FOR DISPLAYING SIMULATION RESULT

BACKGROUND OF THE INVENTION

1. Field of the Invention

The present invention relates to an apparatus for displaying a circuit diagram which is colored according to a result of circuit simulation.

2. Description of the Prior Art

FIG. 1 is a diagram showing a conventional apparatus for displaying a simulation result. Refering to FIG. 1, the apparatus includes a list outputting device 30a and a waveform outputting device 30b. Connection data 26 for simulation for an object circuit is obtained through a diagram inputting means 24 which is operated by an operator. A simulator 7 carries out a simulation of the object circuit based upon the connection data 26. Using diagram data 25 obtained with the diagram inputting means 24, the simulator 7 shows a circuit diagram of the simulated circuit with a display or the like.

In the outputting device 30a, a list is made based acccording to the simulation result 8 outputted from the simulator 7, and the list is outputted through a printer 27 under control of list outputting means 20.

The waveform outputting device 30b is operable to display waveforms in operations of circuit elements. The waveform outputting device 30b includes data inputting means 21, simulation result reading means 22, waveform outputting means 23 and a display 24. With the data inputting means 21, an electric element is selected from the elements included in the object circuit for displaying the output waveform thereof. Then, in response to an output from the data inputting means 21, the simulation result reading means 22 selects only data necessary for displaying the waveform of the selected element from the simulation result 8, to deliver the selected data to the waveform outputting means 23. In response to an output from the simulation result reading means 22, the waveform which shows the operation of the element selected by the data inputting means 21 is displayed on the display 24 under control of the waveform outputting means 23.

In order to confirm the result of the simulation, the operator compares the circuit diagram of the object circuit with the list and the waveform which are obtained through the list outputting device 30a and the waveform outputting device 30b, respectively.

In the prior art apparatus, therefore, it is necessary to check a list and a waveform with a circuit diagram of an object circuit. Accordingly, the prior art apparatus has a disadvantage that investigation of the simulation result requires much labor.

SUMMARY OF THE INVENTION

The present invention is intended for an apparatus for displaying a simulation result of an electric circuit.

According to the present invention, the apparatus comprises; (a) means for inputting diagram data expressing a diagrammatic structure of an object circuit as a combination of unit elements, wherein electronic elements and branches of signal lines interconnecting the electronic elements in the object circuit are regarded as the unit elements, (b) means for inputting simulation data expressing a simulation result of the object circuit, the simulation data including components which indicate respective electric states of the unit elements in simulation, (c) means for holding evaluation data which express a criterion required for evaluating the respective electric states of the unit elements, the criterion being variable by varing the evaluation data, (d) means for receiving the diagram data, the simulation data and the evaluation data from the means (a), (b) and (c), respectively, and for evaluating the respective electric states according to the criterion to generate an image data expressing a circuit diagram of the object circuit in which the unit elements are colored according to a result of evaluation of the respective electric states, and (e) means for receiving the image data from the means (d) to display the circuit diagram in colors.

Preferably, the criterion is a criterion for classifying an operation range of each unit element into a plurality of divisional ranges to which a plurality of colors are assigned, respectively. According to a preferred embodiment of the present invention, the means (d) includes: (d-1) means for comparing each of the components in the simulation data with corresponding divisional ranges to find respective colors for the unit elements within the plurality of colors, the unit elements being displayed with the means (e) in the respective colors.

According to the present invention, the circuit diagram is displayed as a color image in which the unit elements are colored according to the result of the evaluation of the electric states thereof in the simulation.

Since the unit elements of the circuit displayed in colors are electronic elements and branches of signal lines, the simulation result can be observed in detail.

Accordingly, it is an object of the present invention to provide a simulation result display apparatus with which a result of simulation can be easily understood.

These and other objects, features, aspects and advantages of the present invention will become more apparent from the following detailed description of the present invention when taken in conjection with the accompanying drawings.

BRIEF DESCRIPTION OF THE DRAWINGS

FIG. 7 is a view showing a result of simulation inputted to simulation result reading means;

FIG. 8 is a view showing the simulation result converted by the simulation result reading means;

FIG. 9 is a view showing an evaluation table;

FIG. 10 is a view showing diagram data converted by diagram data modifying means;

DETAILED DESCRIPTION OF THE PREFERRED EMBODIMENT

Figure 1:
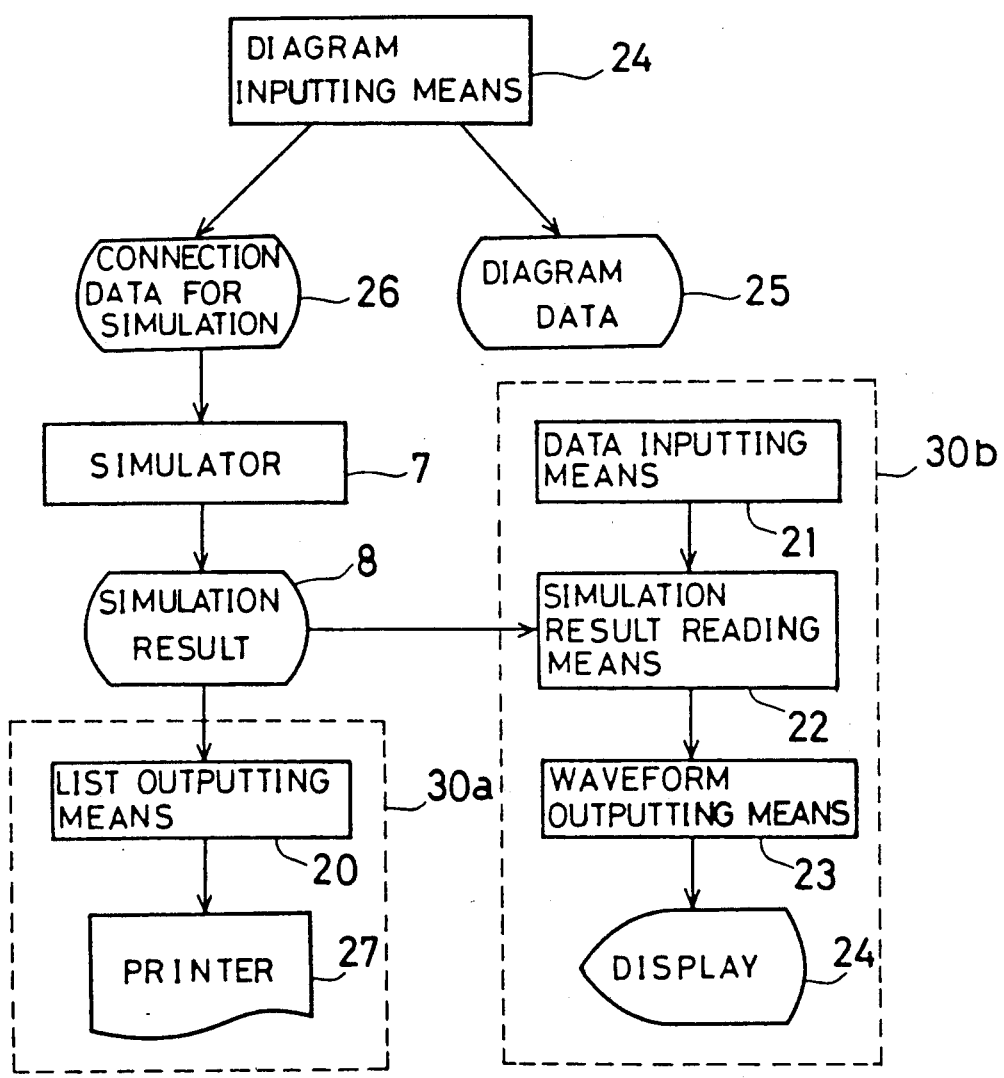
FIG. 1 is a block diagram showing a prior art apparatus.
Figure 2:
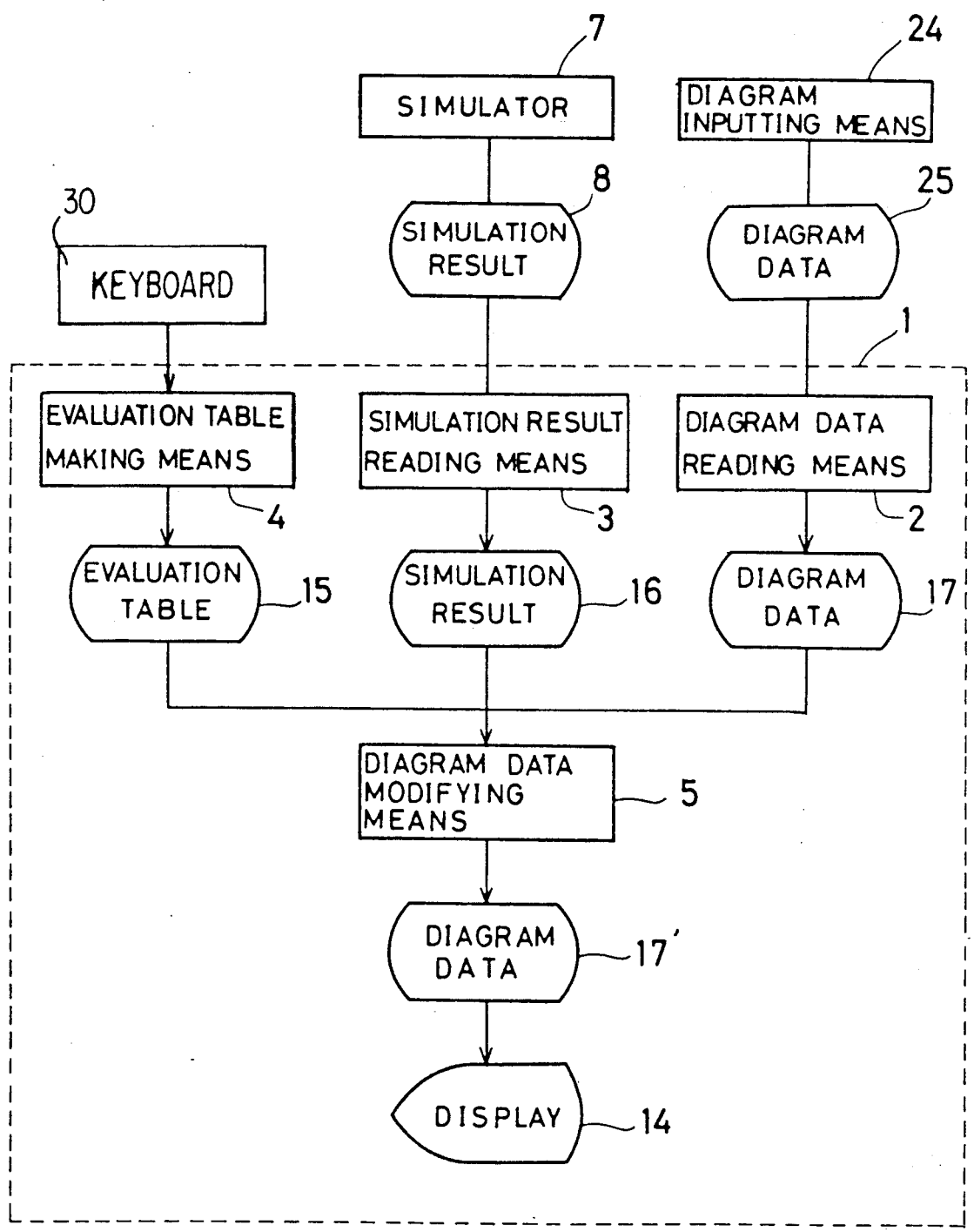
FIG. 2 is a block diagram showing an apparatus according to an embodiment of the present invention.

FIG. 2 is a block diagram showing a simulation result display apparatus including both structure and data flow according to a preferred embodiment of the present invention. Diagram data 25 is made under control of diagram inputting means 24 by an operator using a mouse, a tablet or the like. The diagram data 25 is read by a simulation result display apparatus 1 through diagram data reading means 2 therein.

Figures 3, 4:
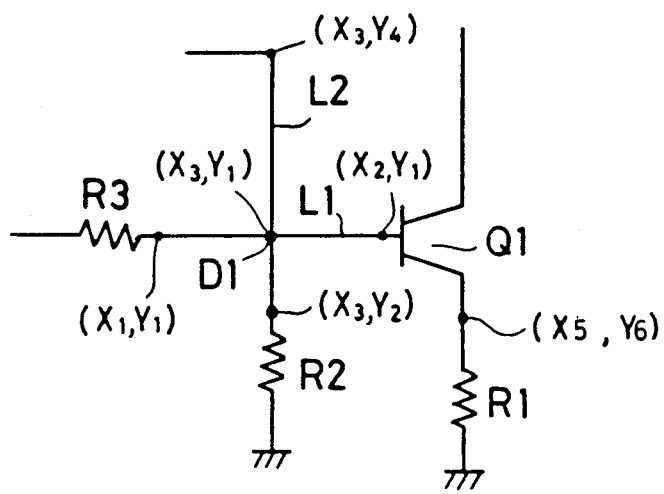
FIG. 3 is a circuit diagram showing an example of an object circuit which is subjected to the simulation.
FIG. 4 is a view showing diagram data inputted into diagram data reading means.
Figures 5, 6:
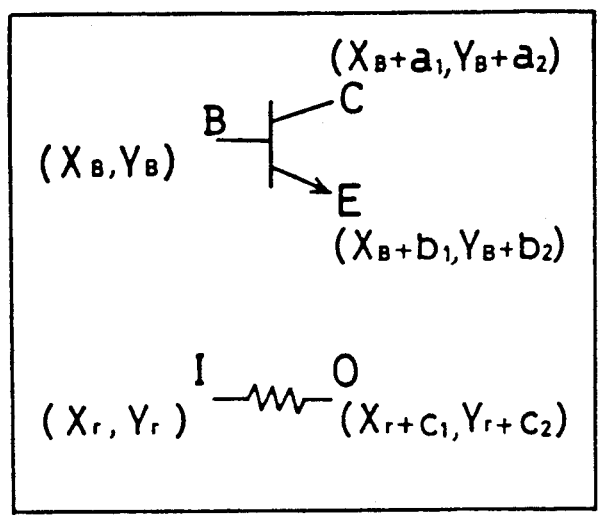
FIG. 5 is a diagram showing respective positional coordinates of electric elements included in the object circuit.
FIG. 6 is a view showing diagram data converted by diagram data reading means.

When an object circuit which is intended for a simulation is that shown in FIG. 3, the diagram data 25 may be that shown in FIG. 4. In FIG. 4, symbols Q, R, L and D denote elements of the circuit, that is, a transistor, a resistance, a signal line and a branch point, respectively. These symbols are accompanied with numerals for discriminating same type elements from each other. The symbols Q for a transistor and R for a resistance are accompanied with two dimensional coordinates corresponding to coordinates $(X_B, Y_B)$ for the base position of the transistor (see FIG. 5) and coordinates $(X_r, Y_r)$ for the position of one end of the resistance (see FIG. 5), respectively. In FIG. 5, coordinates $(X_B + a_1, Y_B + a_2)$, $(X_B + b_1, Y_B + b_2)$ and $(X_r + c_1, Y_r + c_2)$ are those for the collector of the transistor, the emitter thereof and the other end of the resistance, respectively. In FIG. 4, coordinates of the denoting the branch point is shown on the right of the symbol D. Respective coordinates of two elements (a transistor and a resistance, or the like) which are connected to respective ends of the signal line are shown on the right of the symbol L denoting the signal line. For example, since the signal line L1 has two ends connected to the base of the transistor Q1 and one end of a resistance R3, respectively, the signal line L1 is expressed as "L1 $(X_1, Y_1)$ $(X_2, Y_1)$" corresponding to the coordinates $(X_2, Y_1)$ of the base of the transistor Q1 and the coordinates $(X_1, Y_1)$ of the other end of the resistance R3. Further, a color code "WHITE" is added to each symbol to show an initial state.

The diagram data reading means 2 reads the diagram data 25 shown in FIG. 4 and converts it into a diagram data 17 as shown in FIG. 6. In the diagram data 17, the data for the signal line L is divided at the position of the branch point D. For example, the data for the signal line L1 included in the diagram data 25 correspond to data for two signal lines L1a, L1b divided at a branch point D1 in the diagram data 17. The data for the signal lines L1a and L1b are indicated as "L1a$(X_1, Y_1)$ $(X_3, Y_1)$" and "L1b$(X_3, Y_1)$ $(X_2, Y_1)$", respectively. Thus, the signal line L is divided into branches. The reason for such division is that respective currents flowing in the signal lines L1a and L1b may be different from each other. In other words, a signal line in which results of simulation (currents in this case) may be different between respective branches is divided into a plurality of signal lines.

A simulation result 8 given by a simulator 7 shown in FIG. 7, for example, is read by a simulation result reading means 3 in the simulation result display apparatus 1. The simulation result reading means 3 outputs a simulation result 16 as shown in FIG. 8. The simulation result 16 is obtained by extracting data necessary for displaying a colored circuit diagram of the object circuit from the simulation result 8. In FIGS. 7 and 8, there are indicated a base current IB and a collector current IC in amperes. Also indicated are a base-emitter voltage VBE, a base-collector voltage VBC and a collector-emitter voltage VCE in volts. BETADC stands for a grounded emitter current amplification factor $h_{FE}$.

The operator uses a keyboard or the like as inputting means 30 under control of evaluation table making means 4 to make an evaluation table 15 consisting of tables 15a and 15b as shown in FIG. 9. The evaluation table 15a is prepared for classifying respective currents flowing in the signal line L and the resistance R into a plurality of current ranges to which colors are assigned, and the evaluation table 15b is prepared for classifying the operation conditions of the transistor with colors. The evaluation table 15 shows the classifications in colors. For example, when a current value is between zero to 10 μA as a result of a simulation, the signal line and/or the resistance through which the current flows is provided with red. When the base-emitter voltage VBE of the transistor is 0.6 V or more and the collector-emitter voltage VCE is 0.2 V or more, the transistor is provided with blue for indicating normal operation thereof.

Diagram data modifying means 5 compares the simulation result 16 with the current and voltage ranges in the evaluation table 15, to generate diagram data 17' in which color code for each element (Q1, R1, R2, R3, L1a, ...) in the diagram data 17 is modified according to the coloring rules indicated in the table 15.

Figure 11:
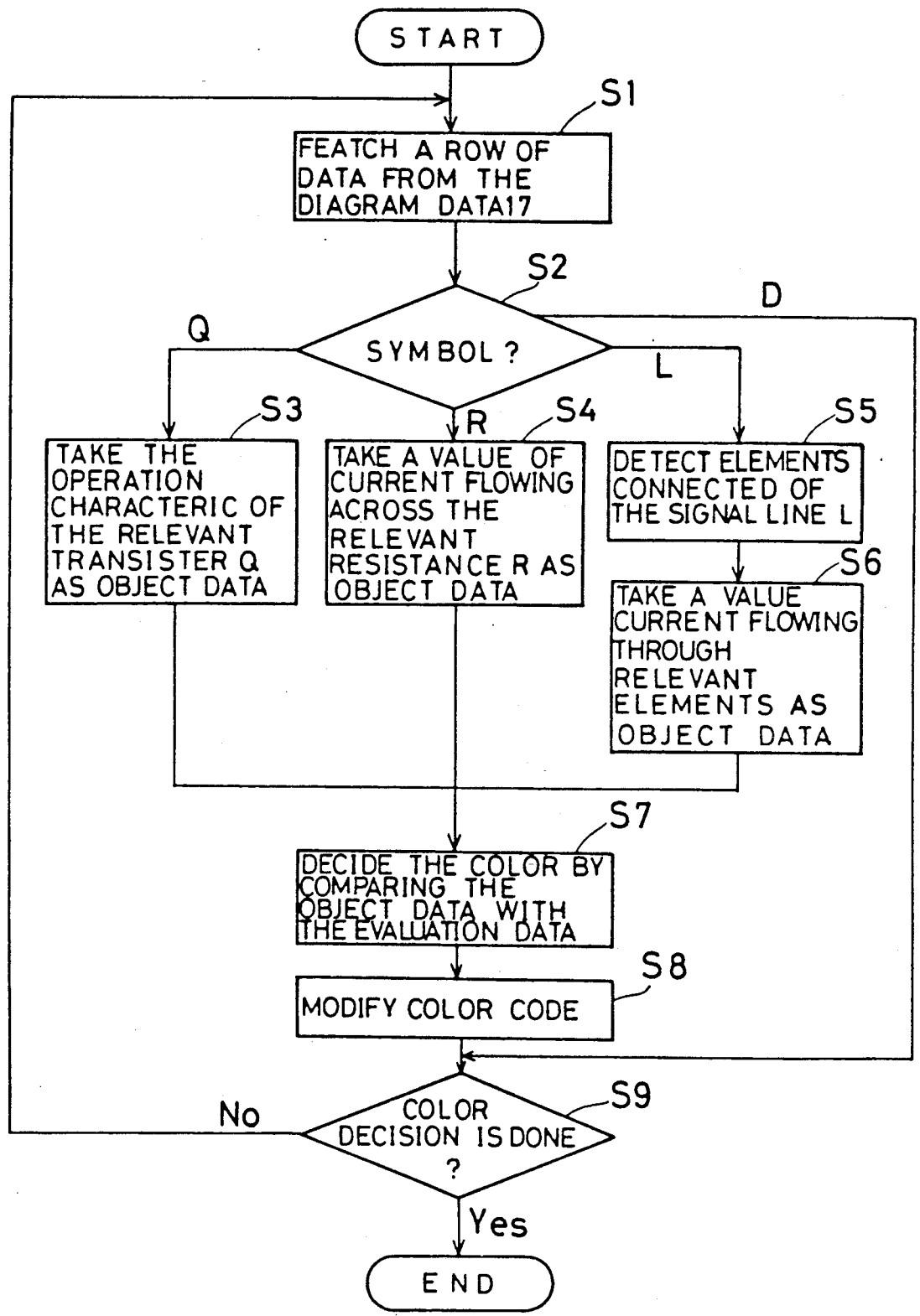
FIG. 11 is a flowchart showing a modification process which is carried out in the diagram data modifying means.

A microcomputer may be provided in the simulation result display 1. In this case, the evaluation table 15, simulation result 16 and the diagram data 17 can be temporarily stored in a memory, and thereafter, they are delivered to the diagram data modifying means 5 for the modification thereof. The modifying operation will be now described with reference to FIG. 11.

In Step S1, a row of data in the diagram data 17 is fetched into the means 5. Then, in Step S2, a symbol included in the fetched data is identified. When the symbol is Q standing for the transistor, a result of simulation on the operation characteristic of the transistor Q is fetched as object data from the simulation result 16 in Step S3. When the symbol is R standing for the resistance, a value of current flowing across the resistance R is given as object data from the simulation result 16 in Step S4. When the symbol is L standing for the signal line, an element (the transistor Q, the resistance R or the like) whose coordinates correspond to those of one end of the signal line L is found in Step S5. In other words, in Step S5, every element connected to any one of ends of the signal line L is found. In Step S6, a value of current flowing through the elements connected to any one of the ends of the signal line L is given as object data from the simulation result 16.

An example of the operation in Steps S5 and S6 will now be described. Assuming that the read data is "L1b $(X_3, Y_1)$ $(X_2, Y_1)$ WHITE", an element whose coordinates are $(X_3, Y_1)$ or $(X_2, Y_1)$ is retrieved in Step S5, so that data "Q1 $(X_2, Y_1)$ WHITE" is found. Thus, it is recognized that the signal line L1b is connected to the base of the transistor Q1. In Step S6, 1 μA of base current of the transistor Q1 is given as object data from the simulation result 16, whereby the object data for the signal line L1b is obtained.

Meanwhile, when the symbol is identified as D standing for a branch point in Step S2, control step jumps to Step S9 because there is no necessity for modifying color code for the branch point D.

After getting the object data in Steps S3 to S6, the object data is compared with corresponding parts of the evaluation table 15 to decide a color for the element in Step S7. Based upon the color decision made in Step S7, the color code in the row is modified in Step S8. When the row of data read in Step S1 is "L1$b$ (X$_3$, Y$_1$) (X$_2$, Y$_1$) WHITE", for example, 1 $\mu$A of the base current of the transistor Q1 is given as the object data as previously described, so that "RED" is decided from the evaluation table 15. Accordingly, the data on the row is modified to "L1$b$ (X$_3$, Y$_1$) (X$_2$, Y$_1$) RED".

In Step S9, it is checked whether color decision for all data in the diagram data 17 has been made. When data for which color decision has not been made exists, Step S1 is carried out again. After that, Steps S1 to S9 are repeated until color decision has been made for all rows in the diagram data 17. Through the process steps described above, the diagram data 17 is modified in color, and the diagram data 17' is obtained.

Figure 12:
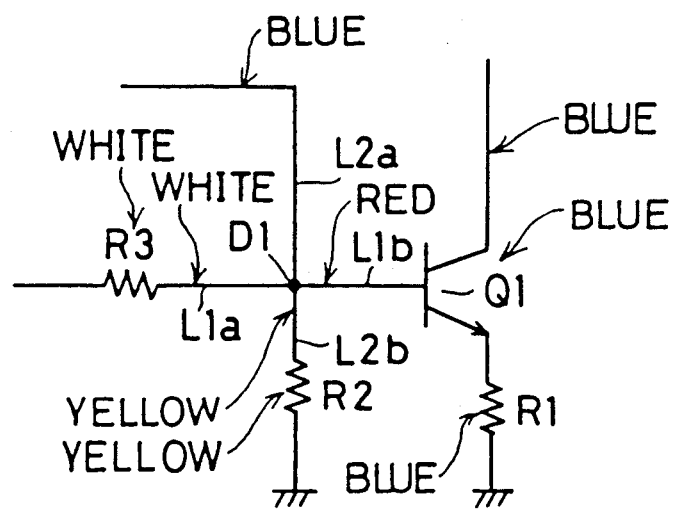
FIG. 12 is a circuit diagram showing a simulated circuit appearing on a display.

Based upon the diagram data 17', a color image data is generated and a circuit diagram of the simulated object circuit is displayed on a color display 14 as shown in FIG. 12, wherein the elements in the object circuit are displayed in respective color decided in the above-indicated process. It is to be noted that the respective color names indicated in FIG. 12 are provided for identifying the colors of respective elements, and they are not displayed words on the color display 14.

Using the above simulation result display apparatus 1, the operator presupposes the operation of the object circuit according to experiential knowledge to make the evaluation table 15 with the evaluation table making means 4, and thereafter the operator carries out simulation for the circuit. Then, the simulation result 8 and the diagram data 25 are outputted to the simulation result display apparatus 1 from the simulator 7 and diagram data making means 2, respectively.

In the simulation result display apparatus 1, the diagram data 25 on the simulated circuit is inputted to the diagram data reading means 2 and converted into the diagram data 17. The simulation result 8 for the simulated circuit is inputed to the simulation result reading means 3. The simulation result 16 necessary for display is extracted from the simulation result 8 by the simulation result reading means 3 as stated above.

After the evaluation table 15, the simulation result 16 and the diagram data 17 are generated, the diagram data modifying means 5 modifies the respective color codes in the diagram data 17 with reference to the data 15 and 16, so that the diagram data 17' is obtained as previously mentioned. After the diagram data 17' is obtained, a circuit diagram expressed in colors as shown in FIG. 12 is displayed on the display 14 as a result of the simulation.

Consequently, the result of the simulation can be confirmed at once because the simulation result is displayed as a color diagram so that the operator can easily understand it. Further, the detailed simulation result can be obtained because the signal line L is divided into partial lines at the branch point D being the dividing point. Furthermore, the evaluation table 15 can be varied by an operator with the evaluation table making means 4, so that criterion for color assignment can be changed depending on simulated circuits. Accordingly, the simulation result can be displayed in respective optimum assignments of colors for various types of object circuits.

Although the present invention has been described and illustrated in detail, it is clearly understood that the same is by way of illustration and example only and is not to be taken by way of limitation, the spirit and scope of the present invention being limited only by the terms of the appended claims.

I claim:

1. An apparatus for displaying a simulation result of an electric circuit, comprising:
   (a) means for inputting diagram data expressing a diagrammatic structure of an object circuit as a combination of unit elements, wherein electronic elements and branches of signal lines interconnecting said electronic elements in said object circuit are regarded as said unit elements,
   (b) means for inputting simulation data expressing a simulation result of said object circuit said simulation data including components which indicate respective electric states of said unit elements in simulation,
   (c) means for inputting and holding evaluation data which express a criterion required for evaluating said respective electric states of said unit elements, said criterion being variable by varing said evaluation data,
   (d) means for receiving said diagram data. said simulation data and said evaluation data from the means (a), (b) and (c), respectively, and for evaluating said respective electric states according to said criterion to generate an image data expressing a circuit diagram of said object circuit in which said unit elements are colored according to a result of evaluation of said respective electric states, and
   (e) means for receiving said image data from the means (d) to display said circuit diagram in colors.

2. An apparatus of claim 1, wherein
said criterion is a criterion for classifying an operation range of each unit element into a plurality of divisional ranges to which a plurality of colors are assigned, respectively, and
the means (d) includes:
   (d-1) means for comparing each of said components in said simulation data with corresponding divisional ranges to find respective colors for said unit elements within said plurality of colors, said unit elements being displayed with the means (e) in said respective colors.

3. An apparatus of claim 2, wherein
said diagram data has first components expressing said unit elements with respective coordinates of said unit elements on said circuit diagram, and second components associated with said first components for indicating respective color codes for said unit elements,
said respective color codes are initialized into predetermined one color, and
the means (d) includes:
   (d-2) means for modifying said respective color codes of said unit elements from said predetermined one color to said respective colors found by the means (d-1).

4. An apparatus of claim 3, wherein
said unit elements include connection points at which said electronic elements and/or said branches are interconnected.

5. An apparatus of claim 3, wherein
said predetermined one color is included in said plurality of colors.

6. An apparatus of claim 2, wherein
said operation range for each branch of said signal lines is a current range.

7. An apparatus of claim 2, wherein
respective colors which are assigned to said divisional ranges are different from each other.

* * * * *